United States Patent
Chang et al.

(10) Patent No.: US 9,431,070 B1
(45) Date of Patent: Aug. 30, 2016

(54) MEMORY APPARATUS

(71) Applicant: National Tsing Hua University, Hsinchu (TW)

(72) Inventors: Meng-Fan Chang, Taichung (TW); Yu-Lin Chen, Tainan (TW); Chia-Yin Li, Taipei (TW); Tien-Fu Chen, Hsinchu (TW); Keng-Hao Yang, Chiayi County (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 14/840,054

(22) Filed: Aug. 31, 2015

(51) Int. Cl.
| | |
|---|---|
| *G11C 7/00* | (2006.01) |
| *G11C 7/06* | (2006.01) |
| *G11C 11/4091* | (2006.01) |
| *G11C 11/16* | (2006.01) |
| *G11C 13/00* | (2006.01) |
| *G11C 11/419* | (2006.01) |
| *G11C 7/12* | (2006.01) |

(52) U.S. Cl.
CPC ............... *G11C 7/062* (2013.01); *G11C 7/12* (2013.01); *G11C 11/1673* (2013.01); *G11C 11/4091* (2013.01); *G11C 11/419* (2013.01); *G11C 13/004* (2013.01); *G11C 13/0004* (2013.01)

(58) Field of Classification Search
USPC ............................................. 365/49.1, 189.07
See application file for complete search history.

(56) References Cited

U.S. PATENT DOCUMENTS

| | | | |
|---|---|---|---|
| 9,021,194 B2 | 4/2015 | Ramaraju et al. | |
| 2002/0126523 A1* | 9/2002 | Ogura | G11C 15/04 365/154 |
| 2004/0120191 A1 | 6/2004 | Nakase | |
| 2006/0250833 A1* | 11/2006 | Sachan | G11C 15/04 365/49.17 |

FOREIGN PATENT DOCUMENTS

| | | |
|---|---|---|
| CN | 102272851 | 2/2015 |
| CN | 104424132 | 3/2015 |
| TW | 172823 | 11/1991 |
| TW | 508582 | 11/2002 |

OTHER PUBLICATIONS

"eTag: On-Die Tag-Comparison eDRAM to Improve DRAM Cache Latency with Direct Data Accesses," HPCA 2016 Submission #265, not yet published.

* cited by examiner

*Primary Examiner* — Hoai V Ho
(74) *Attorney, Agent, or Firm* — Jianq Chyun IP Office

(57) ABSTRACT

The present disclosure provides a memory apparatus including a memory cell array, a plurality of sense amplifiers, at least one first comparing circuit, and a plurality of second comparing circuit. The memory cell array includes a plurality of memory cells. Each of the sense amplifier generates a data signal and an inverted data signal according to a bit line signal and an inverted bit line signal. The first comparing circuits compares the data signals of first and second sense amplifiers with a first tag to generate a first comparing result. The second comparing circuits respectively compare a plurality of second tags with the data signals of the sense amplifiers to respectively generate a plurality of second comparing results.

21 Claims, 8 Drawing Sheets

MEMORY APPARATUS

BACKGROUND OF THE INVENTION

1. Field of Invention

The present invention generally relates to a memory apparatus, and more particularly to the dynamic random access memory apparatus with tag comparing scheme.

2. Description of Prior Art

Along with the rapid development of science and technology at the present, electronic apparatus becomes a popular tool for people. In an electronic apparatus, semiconductor memories are widely used for storing information. For some application, a tag memory is necessary for a cache system in the electronic apparatus with one or more processor.

In conventional art, a tag memory always compares tag with data stored in memory by a plurality of XOR gates. As a person skilled in the art knows, a plurality of transistors (6-8 transistors) are necessary for forming an XOR gate. That is, a large layout area is necessary for a comparison circuit of the tag memory, and cost of the tag memory is increased correspondingly.

SUMMARY OF THE INVENTION

The present disclosure provides a memory apparatus which can perform a tag comparison operation.

The present disclosure provides the memory apparatus including a memory cell array, a plurality of sense amplifiers, at least one first comparing circuit, and a plurality of second comparing circuit. The memory cell array includes a plurality of memory cells. The sense amplifiers are coupled to the memory cell array, and each of the sense amplifier generates a data signal and an inverted data signal according to a bit line signal and an inverted bit line signal. The first comparing circuit is coupled to a first sense amplifier and a second sense amplifier, wherein the first comparing circuits compares the data signals of the first and second sense amplifiers with a first tag to generate a first comparing result. The second comparing circuits are respectively coupled to the sense amplifiers which are not coupled to the first comparing circuit. Wherein the second comparing circuits respectively compare a plurality of second tags with the data signals of the sense amplifiers to respectively generate a plurality of second comparing results.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiment of the invention, examples of which are illustrated in the accompanying drawings.

Figure 1:
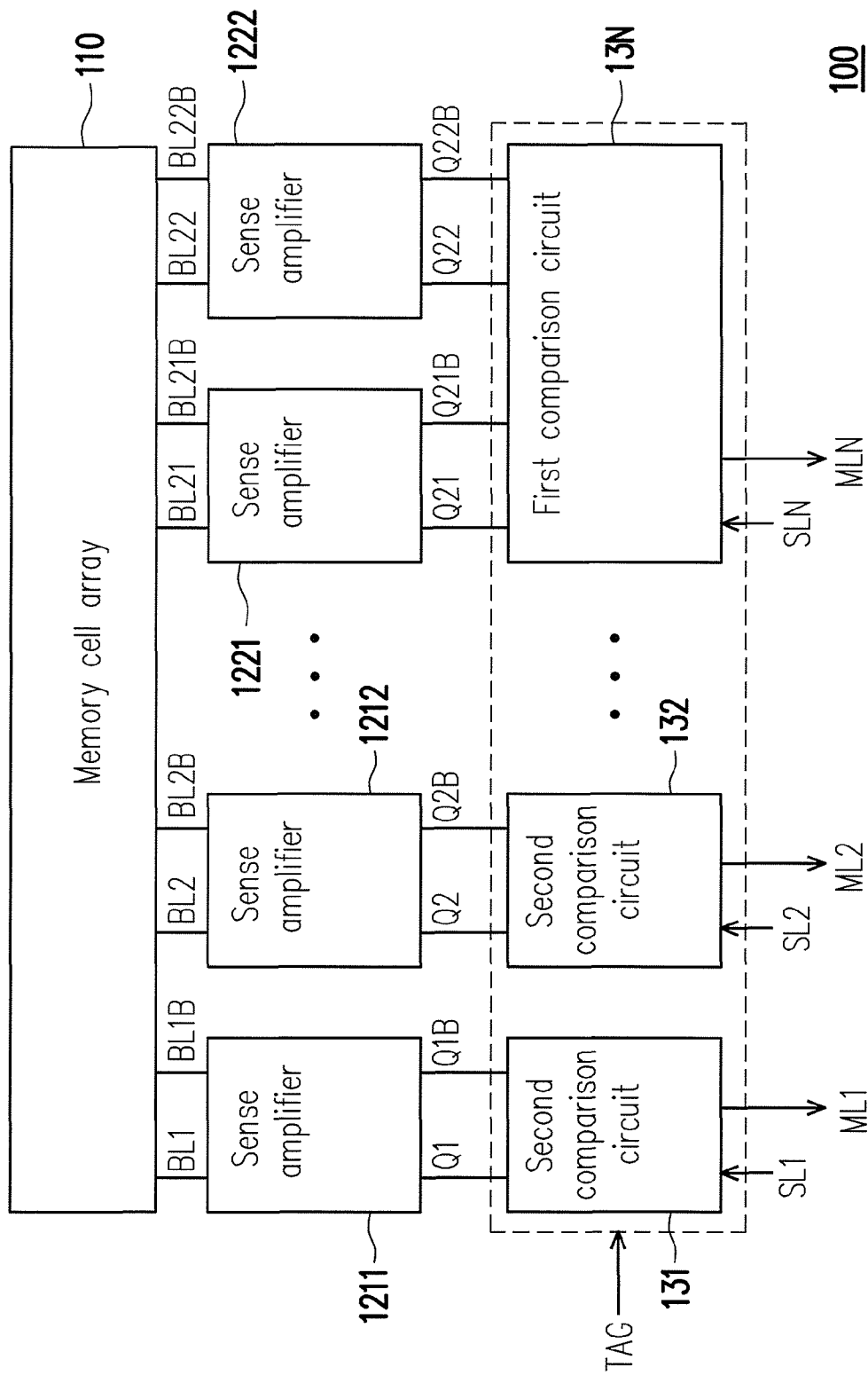
FIG. 1 illustrates a block diagram of a memory apparatus according to an embodiment of present disclosure.

Referring to FIG. 1, FIG. 1 illustrates a block diagram of a memory apparatus according to an embodiment of present disclosure. The memory apparatus 100 includes a memory cell array 110, a plurality of sense amplifiers 1211, 1212, 1221 and 1222, a first comparison circuit 13N, and a plurality of second comparison circuits 131-132. The memory cell array 110 includes a plurality of memory cells, and the memory cells are arranged in an array, and the memory cells may be random access memory (RAM) cells. The sense amplifiers 1211, 1212, 1221 and 1222 are coupled to the memory cell array 110. In FIG. 1, from the memory cell array 110, the sense amplifier 1211 receives a bit line signal BL1 and an inverted bit line signal BL1B, the sense amplifier 1212 receives a bit line signal BL2 and an inverted bit line signal BL2B, the sense amplifier 1221 receives a bit line signal BL21 and an inverted bit line signal BL21B, and the sense amplifier 1222 receives a bit line signal BL22 and an inverted bit line signal BL22B. Each of the sense amplifiers 1211, 1212, 1221 and 1222 senses the received bit line signal and the inverted bit line signal to generate a data signal and an inverted data signal. In FIG. 1, the sense amplifier 1211 generates the data signal Q1 and an inverted data signal Q1B by sensing the bit line signal BL1 and the inverted bit line signal BL1B, the sense amplifier 1212 generates the data signal Q2 and an inverted data signal Q2B by sensing the bit line signal BL2 and the inverted bit line signal BL2B, the sense amplifier 1221 generates the data signal Q21 and an inverted data signal Q21B by sensing the bit line signal BL21 and the inverted bit line signal BL21B, and the sense amplifier 1222 generates the data signal Q22 and an inverted data signal Q22B by sensing the bit line signal BL22 and the inverted bit line signal BL22B.

The second comparison circuit 131 and 132 are respectively coupled the sense amplifiers 1211 and 1212. The first comparison circuit 13N is coupled to two sense amplifiers 1221 and 1222. The first comparison circuit 13N receives a first tag SLN, and the second comparison circuits 131 and 132 respectively receive a plurality of second tags SL1 and SL2, wherein the first tag SLN and second tags SL1, SL2 are respectively a plurality of bits of tag information TAG.

About operations of the second comparison circuits 131 and 132, for example, the second comparison circuit 131 receives the second tag SL1, the data signal Q1 and the inverted data signal Q1B and compares the second tag SL1 with the data signal Q1 (or the inverted data signal Q1B) to generate the comparing result ML1. In the embodiment, the comparing result ML1 may be used to indicate whether the data signal Q1 equals to the second tag SL1 or not, and when the data signal Q1 and the second tag SL1 are the same, the comparing result ML1 may be used to show "Hit" and when the data signal Q1 and the second tag are different, the comparing result ML1 may be used to show "Miss".

About operations of the first comparison circuit 13N, in this embodiment, the first comparison circuit 13N receives the data signals Q21, Q22 and inverted data signals Q21B and Q22B, and selects the data signal Q21 and Q22 to be compared with the first tag SLN for generating the comparing result MLN. In this embodiment, when the data signal Q21 and Q22 are different, and when the first tag SLN and the data signal Q21 are the same, the comparing result MLN may be used to show "Hit". When the data signal Q21 and Q22 are different, and when the first tag SLN and the data signal Q21 are the different, the comparing result MLN may be used to show "Miss". Furthermore, when the data signal Q21 and Q22 are the same, the comparing result MLN may be used to show "Hit" regardless whether the first tag SLN is logic "1" or "0".

Please be noted here, in some embodiment, the first tag SLN may be a signal with a plurality of bits. For example, the first tag SLN may be the signal with 2 bits. In this case, if the data signal Q21 is logic "0" and the data signal Q22 is logic "1" and the first tag SLN is 0 1, the comparing result MLN may be used to show "hit". On the other hand, if the data signal Q21 is logic "0" and the data signal Q22 is logic "1" and the first tag SLN is 0 0, 1 0, or 1 1, the comparing result MLN may be used to show "Miss". A number of bits of the first tag SLN can be determined by a number of the sense amplifiers which the first comparison circuit being coupled to.

Additionally, in an embodiment of present disclosure, when the comparing result MLN is used to show "Hit", the comparing result MLN may be logic "1", and when the comparing result MLN is used to show "Miss", the comparing result MLN may be logic "0". Of course, in some embodiment, when the comparing result MLN is used to show "Hit", the comparing result MLN may be logic "0", and when the comparing result MLN is used to show "Miss", the comparing result MLN may be logic "1".

Furthermore, in an embodiment of present disclosure, the memory cells in the memory cell array 110 may be dynamic random access memory (DRAM) cells or embedded dynamic random access memory (eDRAM) cells, in another embodiment, the memory cells in the memory cell array 110 may be magnetoresistive random access memory (MRAM) cells, resistive random access memory (RRAM) cells, phase change memory (PCM) cells and/or static random access memory (SRAM) cells.

Figure 2A:
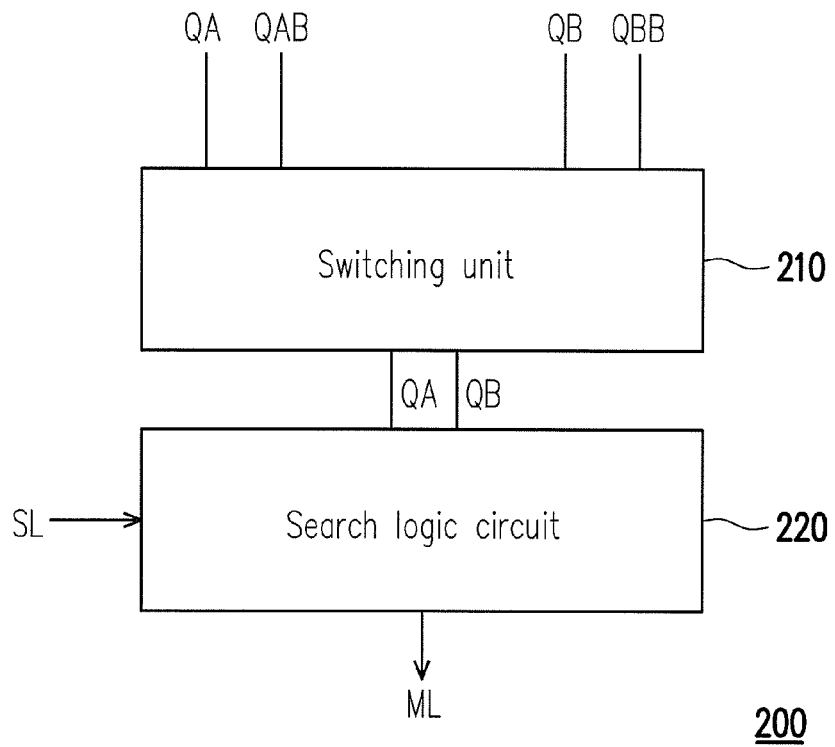
FIG. 2A illustrates a block diagram of the first comparison circuit working in a ternary content addressable memory (TCAM) mode according to an embodiment of present disclosure.

Referring to FIG. 2A, FIG. 2A illustrates a block diagram of the first comparison circuit working in a ternary content addressable memory (TCAM) mode according to an embodiment of present disclosure. The first comparison circuit 200 includes a switching unit 210 and a search logic circuit 220. The switching unit 210 may be coupled to two sense amplifier in the memory apparatus of present disclosure. The switching unit 210 receives a data signal QA and an inverted data signal QAB from one sense amplifier, and receives a data signal QB and an inverted data signal QBB from another sense amplifier. Moreover, the switching unit 210 is used to be configured to the ternary content addressable memory (TCAM) mode or a content addressable memory (CAM) mode, and the switching unit 210 may select the data signals QA and QB, and outputs the data signals QA and QB to the search logic circuit 220 when the switching unit 210 is configured to the TCAM mode.

Figure 2B:
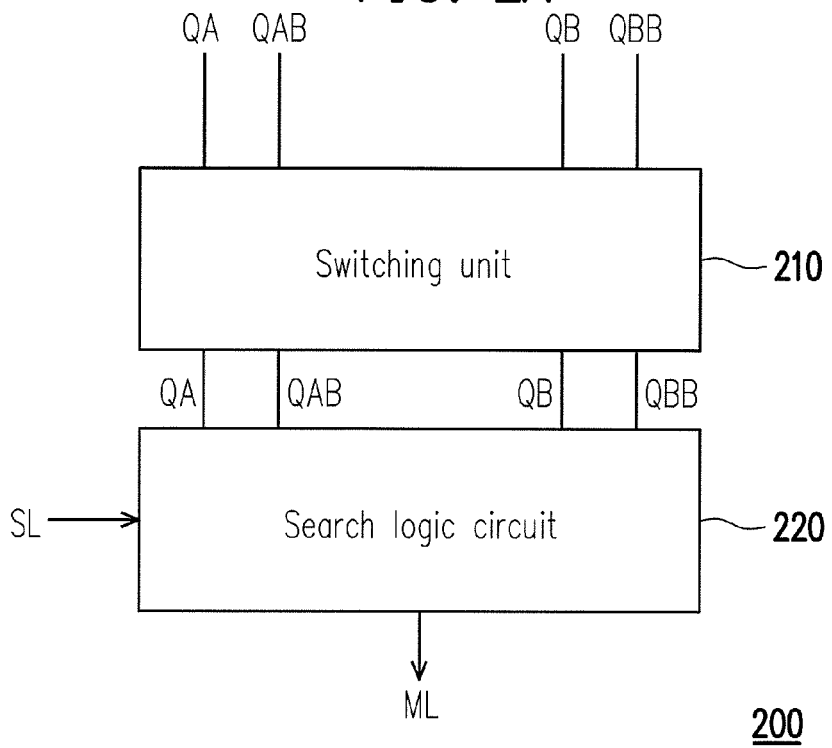
FIG. 2B illustrates a block diagram of the first comparison circuit working in the CAM mode according to an embodiment of present disclosure.

Referring to FIG. 2B, FIG. 2B illustrates a block diagram of the first comparison circuit working in the CAM mode according to an embodiment of present disclosure. When the switching unit 210 works in the CAM mode, the switching unit 210 may select all of the data signals QA, QB and the inverted data signals QAB and QBB for outputting.

The search logic circuit 220 is coupled to the switching unit 210, and when the switching unit 210 outputs the data signals QA and QB to the search logic circuit 220, the search logic circuit 220 may compare the data signals QA and QB with a first tag SL to generate a comparing result ML.

Figure 3:
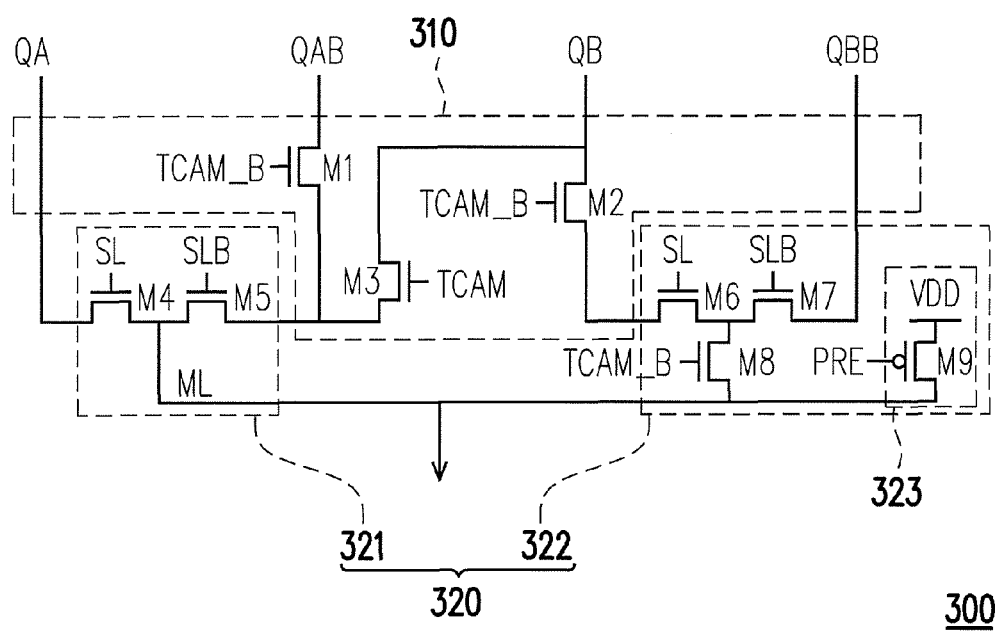
FIG. 3 illustrates a circuit plot of the first comparison circuit according to an embodiment of present disclosure.

The detail operation can be referred to FIG. 3; FIG. 3 illustrates a circuit plot of the first comparison circuit according to an embodiment of present disclosure. The first comparison circuit 300 includes a switching unit 310 and a search logic circuit 320. The switching unit 310 includes three switches which are respectively composed by transistors M1, M2 and M3. A first end of the transistor M1 receives an inverted data line signal QAB, a second end of the transistor M1 is coupled to a part circuit 321 of the search logic circuit 320, and a control end of the transistor M1 receives an inverted mode control signal TCAM_B. A first end of the transistor M2 receives the data line signal QB, a second end of the transistor M2 is coupled to another part circuit 322 of the search logic circuit 320, and a control end of the transistor M2 receives an inverted mode control signal TCAM_B. Moreover, a first end of the transistor M3 receives the data line signal QB, a second end of the transistor M3 is coupled the second end of the transistor M1, and a control end of the transistor M3 receives a mode control signal TCAM. Wherein the mode control signal TCAM is inverted to the inverted mode control signal TCAM_B.

The search logic circuit 320 includes two part circuits 321 and 322 in FIG. 3. The part circuit 321 includes two switches respectively formed by transistors M4 and M5. A first end of the transistor M4 receives the data signal QA, the second end of the transistor M4 outputs a comparing result ML, and a control end of the transistor M4 receives a first tag SL. A first end of the transistor M5 is coupled to the second end of the transistor M1, the second end of the transistor M5 outputs the comparing result ML, and a control end of the transistor M5 receives an inverted first tag SLB.

The part circuit 322 includes two switches respectively formed by transistors M6-M8 and a pre-charge circuit 323. A first end of the transistor M6 is coupled to the second end of the transistor M2, and a control end of the transistor M6 receives a first tag SL. A first end of the transistor M7 receives an inverted data signal QBB, the second end of the transistor M7 is coupled to a second end of the transistor M6, and a control end of the transistor M7 receives an inverted first tag SLB. The transistor M8 is coupled between the second end of the transistor M7 and the second end of the transistor M4, and is controlled by the inverted mode control signal TCAM_B.

The pre-charge circuit 323 includes a switch firmed by a transistor M9. The transistor M9 is coupled between the second end of the transistor M4 and a reference power voltage VDD, and pre-charges the comparing result ML to the reference power voltage VDD according to a pre-charge signal PRE.

When the first comparison circuit 300 operated in a ternary search mode (the TCAM mode), the transistor M3 is turned on according to the mode control signal TCAM, and the transistors M1 and M2 are turned off (cut off) according to the inverted mode control signal TCAM_B. In the ternary search mode, the data signal QA can be directly transported to the part circuit 321 of the search logic circuit 320, and the data signal QAB can be transported to the part circuit 321 of the search logic circuit 320 through the transistor M3.

Furthermore, the transistor M8 is cut off and the part circuit 322 is disabled, and the comparing result ML is not effected by the part circuit 322.

In the ternary search mode, the pre-charge circuit 323 pre-charge the comparing result to the reference power voltage VDD. Then, the pre-charge circuit 323 is disabled, and the transistors M4 and M5 is turned on or turned off according to the first tag SL and the inverted first tag SLB. If the first tag SL is logic "1", and the inverted first tag is logic "0", the transistor M4 is turned on (the transistor M5 is turned off) for passing the data signal QA to be the comparing result ML. On the contrary, if the first tag SL is logic "0", and the inverted first tag is logic "1", the transistor M5 is turned on (the transistor M4 is turned off) for passing the data signal QB to be the comparing result ML. The truth table of the first comparison circuit 300 can be shown as below:

| QA | QB | SL | SLB | ML |
|----|----|----|-----|-----|
| 1  | 1  | 0  | 1   | 1  |
|    | 1  | 1  | 0   | 1  |
| 0  | 1  | 0  | 1   | 1  |
|    | 1  | 1  | 0   | 0  |
| 1  | 0  | 0  | 1   | 0  |
|    | 1  | 1  | 0   | 1  |

On the other hand, the first comparison circuit 322 may be operated in a binary search mode (the CAM mode). In the binary search mode, the transistor M3 is turned off (cut off) according to the mode control signal TCAM, and the transistors M1 and M2 are turned on according to the inverted mode control signal TCAM_B, and the first comparison circuit 300 can be interpreted as two second comparison circuits. The detail operations of the second comparison circuit are shown in following embodiments.

Figure 4A:
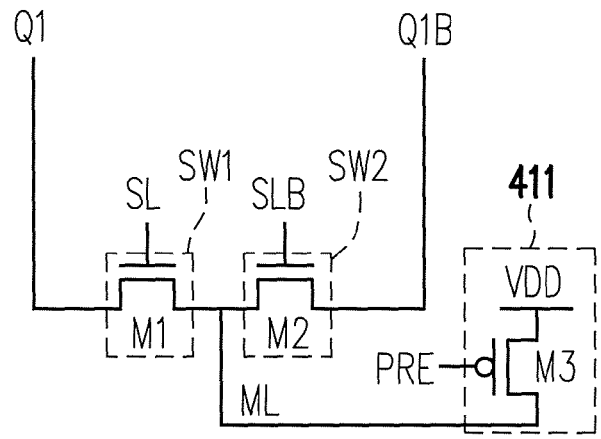
FIG. 4A to FIG. 4E illustrate circuit plots of second comparison circuit according several embodiments of present disclosure.

Referring to FIG. 4A to FIG. 4E, FIG. 4A to FIG. 4E illustrate circuit plots of second comparison circuit according several embodiments of present disclosure. In FIG. 4A, the second comparison circuit 410 includes switches SW1 and SW2, and pre-charge circuit 411. The switches SW1 and SW2 are respectively formed by transistors M1 and M2. A first end of the switch SW1 receives a data signal Q1, a second end of the switch SW1 generates a comparing result ML, and a control end of the switch SW1 receives a second tag SL. A first end of the switch SW2 receives an inverted data signal Q1B, a second end of the switch SW2 generates a comparing result ML, and a control end of the switch SW2 receives an inverted second tag SLB. The pre-charge circuit 411 is formed by a transistor M3. The pre-charge circuit 411 is coupled between the second end of the switch SW1 and the reference power voltage VDD, and pre-charges the comparing result ML to the reference power voltage VDD according to the pre-charge signal PRE.

In the operation of the second comparison circuit 410, firstly, the comparing result ML is pre-charged to the reference power voltage VDD by the pre-charge circuit 411. Then, the pre-charge circuit 411 is disabled, and one of the switches SW1 and SW2 is turned on (another one is turned off) according to the second tag SL and the inverted second tag SLB. Such as that, one of the data signal Q1 and the inverted data signal Q1B is transported to be the comparing result ML. That is, if both of the second tag SL and the data signal Q1 are logic "1" or "0", the comparing result ML is logic "1" ("Hit"), and if one of the second tag SL and the data signal Q1 is logic "1" and another one is logic "0", the comparing result ML is logic "0" ("Miss"). Wherein, the data signal Q1 in inverted to the inverted data signal Q1B.

Figure 4B:
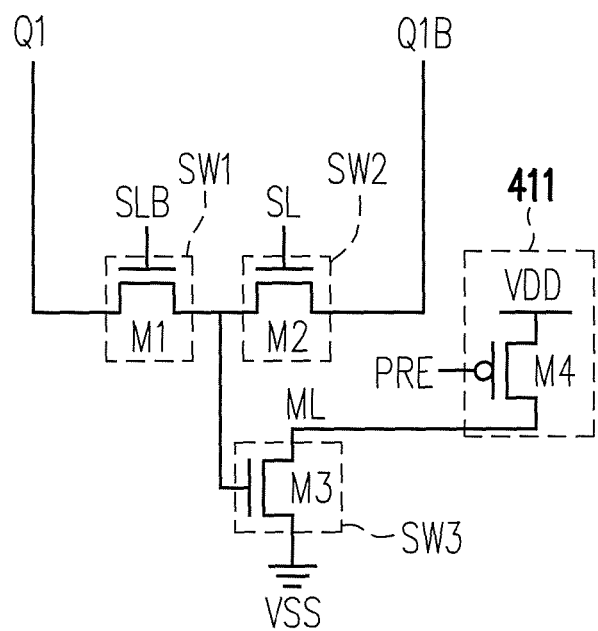

In FIG. 4B, the second comparison circuit 420 includes switches SW1-SW3, and pre-charge circuit 421. The switches SW1-SW3 are respectively formed by transistors M1-M3. A first end of the switch SW1 receives a data signal Q1, a second end of the switch SW1 is coupled to the switch SW3, and a control end of the switch SW1 receives the inverted second tag SLB. A first end of the switch SW2 receives an inverted data signal Q1B, a second end of the switch SW2 is coupled to the switch SW3, and a control end of the switch SW2 receives the second tag SL. A first end of the switch M3 generated the comparing result ML, a second end of the switch SW3 is coupled to the reference ground VSS, and a control end of the switch SW3 is coupled to the second ends of the switches SW1 and SW2. The pre-charge circuit 421 is formed by a transistor M4. The pre-charge circuit 421 is coupled between the first end of the switch SW3 and the reference power voltage VDD, and pre-charges the comparing result ML to the reference power voltage VDD according to the pre-charge signal PRE.

In the operation of the second comparison circuit 420, firstly, the comparing result ML is pre-charged to the reference power voltage VDD by the pre-charge circuit 421. Then, the pre-charge circuit 421 is disabled, and one of the switches SW1 and SW2 is turned on (another one is turned off) according to the second tag SL and the inverted second tag SLB. Such as that, one of the data signal Q1 and the inverted data signal Q1B is transported to the control end of the switch SW3. That is, if both of the second tag SL and the data signal Q1 are logic "1" or "0", the control end of the switch SW3 receives a signal with logic "0" and be turned off. The comparing result ML keeps on logic "1" ("Hit") accordingly. On the other hand, if one of the second tag SL and the data signal Q1 is logic "1" and another one is logic "0", the control end of the switch SW3 receives a signal with logic "1" and be turned on, and the comparing result ML is pulled to logic "0" ("Miss").

Figure 4C:
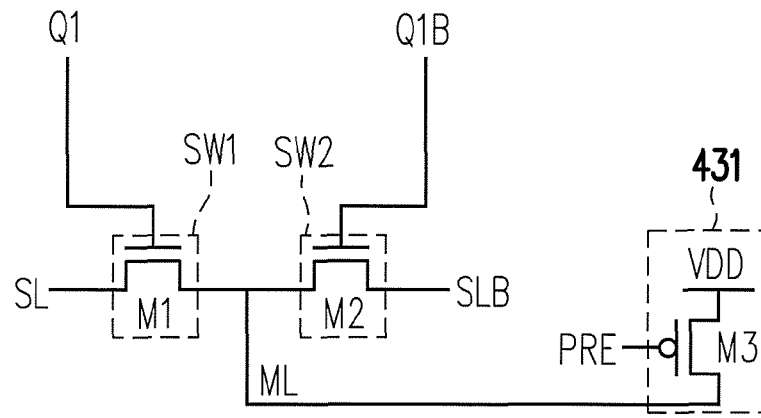

In FIG. 4C, the second comparison circuit 430 includes switches SW1-SW2, and pre-charge circuit 431. The switches SW1-SW2 are respectively formed by transistors M1-M2. The switch SW1 has a first end for receiving the second tag SL, a second end for generating the comparing result ML, and a control end for receiving corresponding data signal Q1. The switch SW2 has a first end for receiving the inverted second tag SLB, a second end for generating the comparing result ML, and a control end for receiving the inverted data signal Q1B.

The pre-charge circuit 431 is formed by a transistor M3. The pre-charge circuit 431 is coupled between the second end of the switch SW1 and the reference power voltage VDD, and pre-charges the comparing result ML to the reference power voltage VDD according to the pre-charge signal PRE.

In the operation of the second comparison circuit 430, firstly, the comparing result ML is pre-charged to the reference power voltage VDD by the pre-charge circuit 431. Then, the pre-charge circuit 431 is disabled, and one of the switches SW1 and SW2 is turned on (another one is turned off) according to the data signal Q1 and the inverted data signal Q1B. Such as that, one of the second tag SL and the inverted second tag SLB is transported to be the comparing result ML. That is, if both of the second tag SL and the data signal Q1 are logic "1" or "0", the comparing result ML is logic "1" ("Hit"), and if one of the second tag SL and the data signal Q1 is logic "1" and another one is logic "0", the comparing result ML is logic "0" ("Miss"). Wherein, the data signal Q1 in inverted to the inverted data signal Q1B.

Figure 4D:
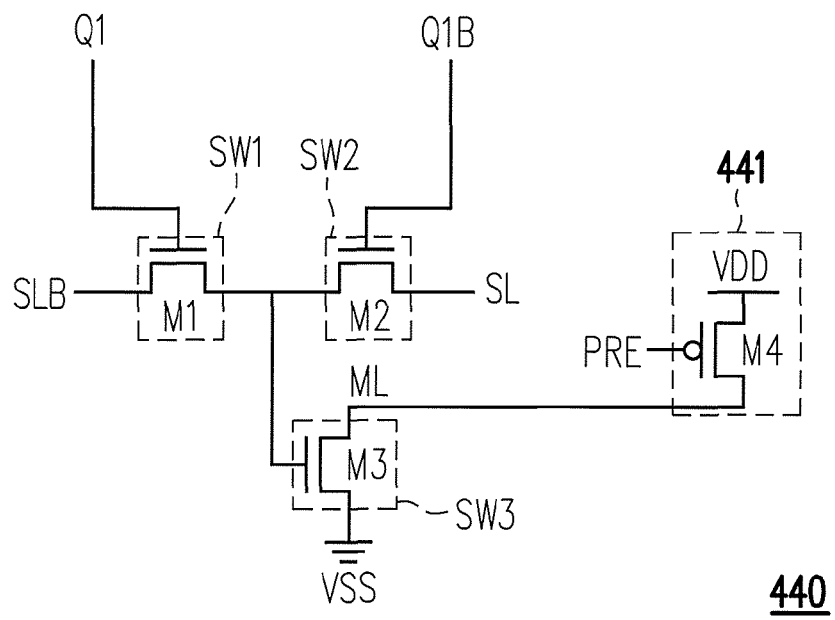

In FIG. 4D, the second comparison circuit 440 includes switches SW1-SW3, and pre-charge circuit 441. The switches SW1-SW3 are respectively formed by transistors M1-M3. A control end of the switch SW1 receives a data signal Q1, a second end of the switch SW1 is coupled to the switch SW3, and a first end of the switch SW1 receives the inverted second tag SLB. A control end of the switch SW2 receives an inverted data signal Q1B, a second end of the switch SW2 is coupled to the switch SW3, and a first end of the switch SW2 receives the second tag SL. A first end of the switch M3 generated the comparing result ML, a second end of the switch SW3 is coupled to the reference ground VSS, and a control end of the switch SW3 is coupled to the second ends of the switches SW1 and SW2. The pre-charge circuit 441 is formed by a transistor M4. The pre-charge circuit 441 is coupled between the first end of the switch SW3 and the reference power voltage VDD, and pre-charges the comparing result ML to the reference power voltage VDD according to the pre-charge signal PRE.

In the operation of the second comparison circuit 440, firstly, the comparing result ML is pre-charged to the reference power voltage VDD by the pre-charge circuit 441. Then, the pre-charge circuit 441 is disabled, and one of the switches SW1 and SW2 is turned on (another one is turned off) according to the data signal Q1 and the inverted data signal Q1B. Such as that, one of the second tag SL and the inverted second tag SLB is transported to the control end of the switch SW3. That is, if both of the second tag SL and the data signal Q1 are logic "1" or "0", the control end of the switch SW3 receives a signal with logic "0" and be turned off. The comparing result ML keeps on logic "1" ("Hit") accordingly. On the other hand, if one of the second tag SL and the data signal Q1 is logic "1" and another one is logic "0", the control end of the switch SW3 receives a signal with logic "1" and be turned on, and the comparing result ML is pulled to logic "0" ("Miss").

Figure 4E:
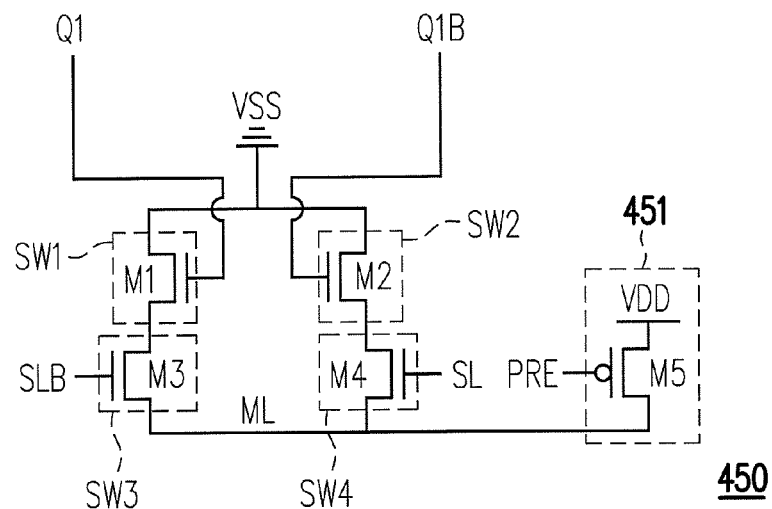

In FIG. 4E, the second comparison circuit 450 includes switches SW1-SW4, and pre-charge circuit 451. The switches SW1-SW4 are respectively formed by transistors M1-M4. The pre-charge circuit 451 is formed by transistor M5. The switch SW1 has a first end coupled to the reference ground VSS, and a control end receiving the data signal Q1. The switch SW2 has a first end coupled to the reference ground VSS, and a control end for receiving the inverted data signal Q1B. The switch SW3 has a first end coupled to a second end of the switch SW1, a second end for generating the comparing result ML, a control end for receiving the inverted second tag SLB. The switch SW4 has a first end coupled to a second end of the switch SW2, a second end for generating the comparing result ML, a control end for receiving the second tag SL. The pre-charge circuit 450 is coupled between the second end of the switch SW3 and the reference power voltage VDD, and pre-charges the comparing result ML to the reference power voltage VDD according to a pre-charge signal PRE.

In the operation of the second comparison circuit 450, firstly, the comparing result ML is pre-charged to the reference power voltage VDD by the pre-charge circuit 451. Then, the pre-charge circuit 451 is disabled, and one of the switches SW1 and SW2 is turned on (another one is turned off) according to the data signal Q1 and the inverted data signal Q1B. Furthermore, one of the switches SW3 and SW4 is turned on (another one is turned off) according to the second tag SL and the inverted second tag SLB. That is, if both of the second tag SL and the data signal Q1 are logic "1" or "0", the comparison result ML may keep on logic "1" ("Hit"), and if one of the second tag SL and the data signal Q1 is logic "1" and another one is logic "0", both of the switches SW1 and SW3 (or the switches SW2 and SW4) are turned on, and the comparing result ML is pulled to logic "0" ("Miss").

Figure 5:
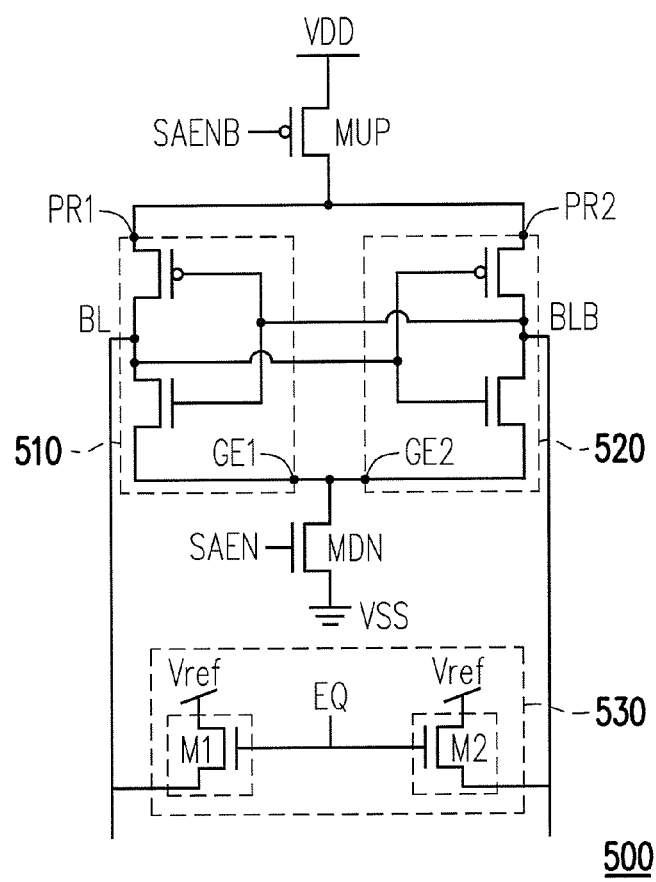
FIG. 5 illustrates a circuit plot of the sense amplifier according to an embodiment of present disclosure.

Referring to FIG. 5, FIG. 5 illustrates a circuit plot of the sense amplifier according to an embodiment of present disclosure. The sense amplifier 500 includes transistors MUP, MDN, inverting circuits 510, 520, and equalization circuit 530. The inverting circuit 510 has an input end for receiving corresponding inverted bit line signal BLB and an output end for generating corresponding bit line signal BL. The inverting circuit 520 has an input end coupled to the output end of the inverting circuit 510, and an output end coupled to the input end of the inverting circuit 510. The transistor MUP is coupled between the reference power voltage VDD and power receiving ends PR1 and PR2 of the inverting circuits 510 and 520, wherein the transistor MUP is controlled by a sensing enable signal SAENB to be turned on or off. The transistor MDN is coupled between the reference ground VSS and ground ends GE1 and GE2 of the inverting circuits 510 and 520, wherein the transistor MDN is controlled by a sensing enable signal SAEN to be turned on or off.

The equalization circuit 530 is coupled between the output ends of the inverting circuits 510 and 520, and equalizes corresponding bit line signal BL and inverted bit lined signal BLB to a reference voltage Vref according to an equalization signal EQ.

Figure 6:
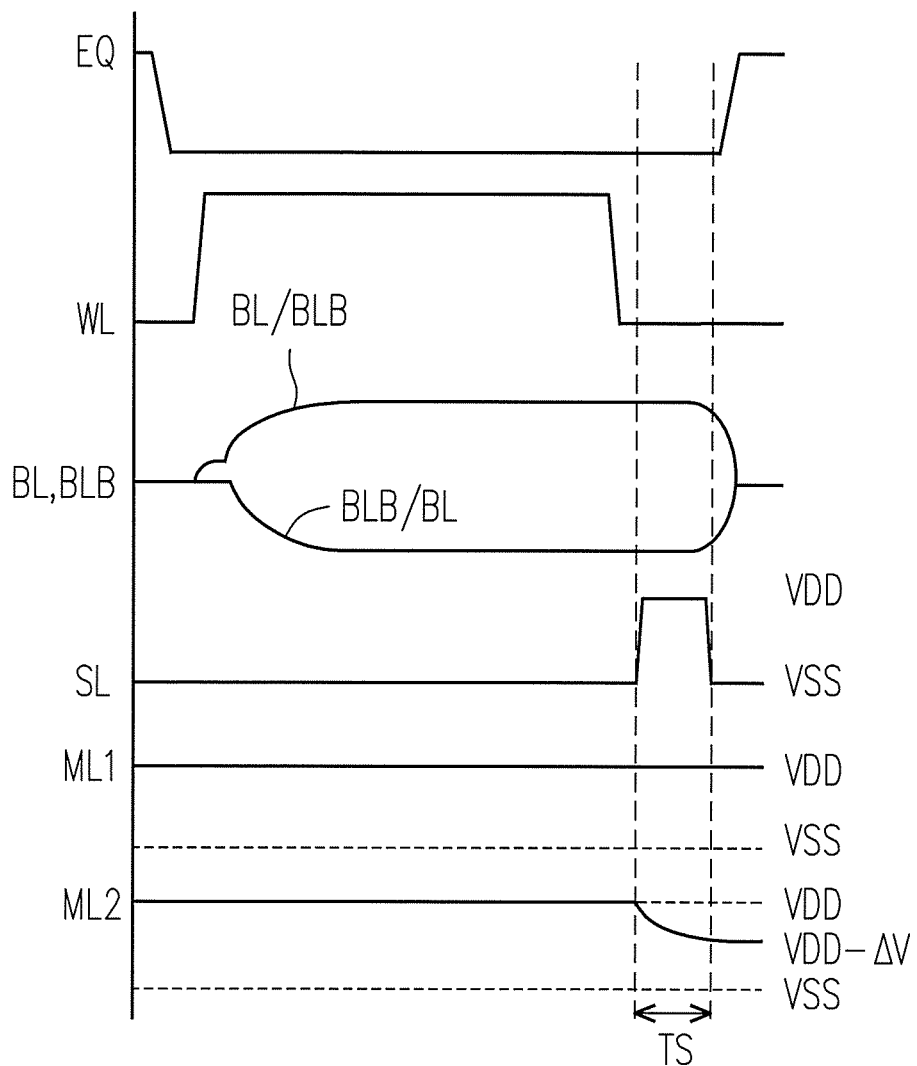
FIG. 6 illustrates a waveform plot of the memory apparatus according to an embodiment of present disclosure.

Referring to FIG. 6, FIG. 6 illustrates a waveform plot of the memory apparatus according to an embodiment of present disclosure. In initial time period, the equalization signal EQ is set to high for equalizing a bit line signal and an inverted bit line signals of a sense amplifier. Then, the equalization signal EQ is set to low. Further, a word line signal WL is enabled (pulled to high voltage level), and data stored in memory cell is transported to the bit line signal BL and the inverted bit line signal BLB. During a sensing time period TS, a compare signal SL is enabled, and the bit line signal BL and the inverted bit line signal BLB are respectively transported to be a data signal and an inverted data signal. Such as that, the first and second comparison circuits of the memory apparatus may compare the tag information with the data signal, and "Hit" or "Miss" status can be determined by the first and second comparison circuits.

The comparing result ML1 shows "Hit" status, and the voltage level of the comparing result ML1 holds on high voltage level. On the contrary, the comparing result ML2 shows "Miss" status, and the voltage level of the comparing result ML2 is reduced from the reference voltage power VDD to VDD−V. Wherein, V is an offset voltage level.

Figure 7:
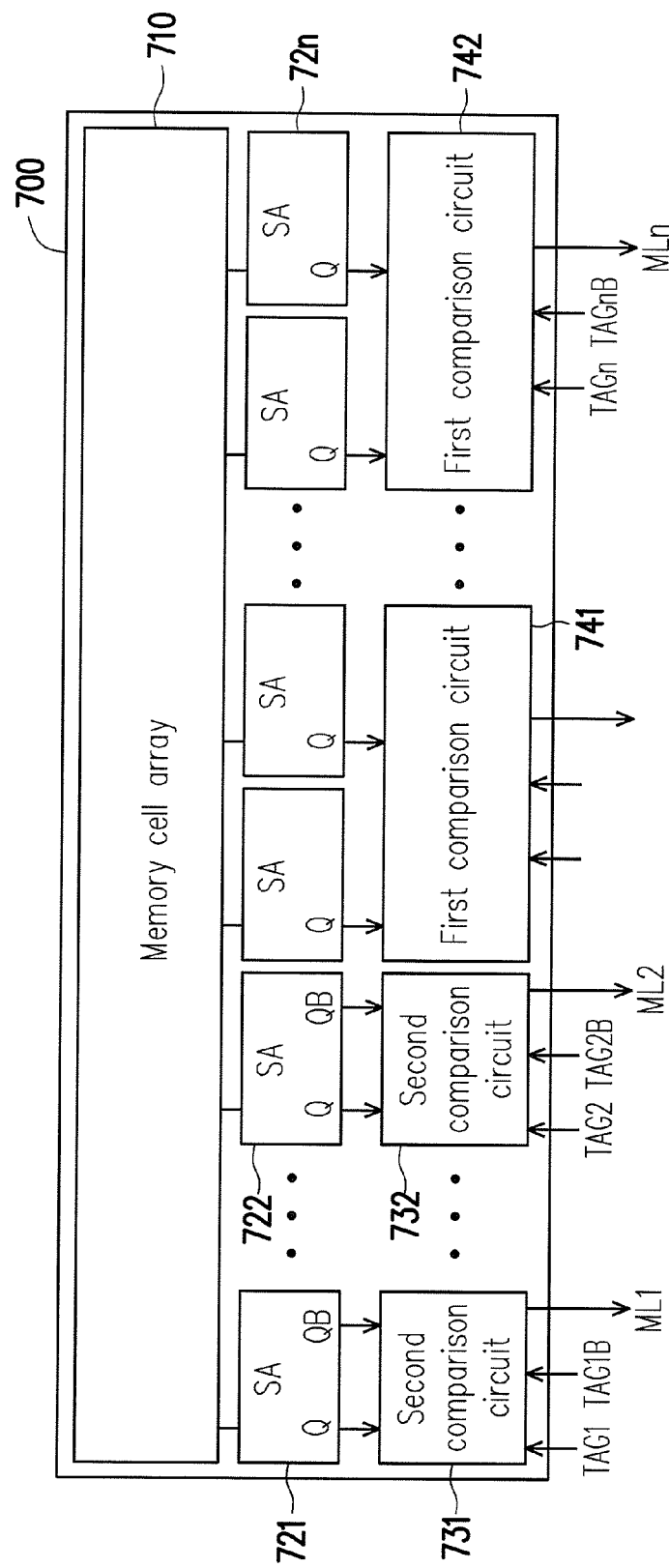
FIG. 7 illustrates a memory apparatus according to another embodiment of present disclosure.

Referring to FIG. 7, FIG. 7 illustrates a memory apparatus according to another embodiment of present disclosure. The memory apparatus 700 includes a memory cell array 710, a plurality of sense amplifier 721-72n, a plurality of first comparison circuits 741-742, and a plurality of second comparison circuit 731-732. Please be noted here, a number of the first comparison circuits 741-742 can be large than 1, and Each of the first comparison circuits 741-742 is coupled to two of the sense amplifiers. In FIG. 7, the tag information with n bit (TAG1-TAGn) can be compared with data stored in the memory cell array 710, and comparing result ML1-MLn can be obtained with "Hit" or "Miss" statuses.

In summary, the present disclosure provides two different comparison circuits for comparing data signal from memory cells and tag information. That is, "Hit" or "Miss" statuses can be obtained easily, and both of the binary and ternary search mode can be used in the memory apparatus. That is, a performance of the memory apparatus can be improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents

What is claimed is:

1. A memory apparatus, comprising:
  a memory cell array, comprising a plurality of memory cells;
  a plurality of sense amplifiers, coupled to the memory cell array, and each of the sense amplifier generates a data signal and an inverted data signal according to a bit line signal and an inverted bit line signal;
  at least one first comparing circuit, coupled to a first sense amplifier and a second sense amplifier, wherein the first comparing circuits compares the data signals of the first and second sense amplifiers with a first tag to generate a first comparing result; and
  a plurality of second comparing circuits, respectively coupled to the sense amplifiers which are not coupled to the first comparing circuit, wherein the second comparing circuits respectively compare a plurality of second tags with the data signals of the sense amplifiers to respectively generate a plurality of second comparing results.

2. The memory apparatus according to claim 1, wherein the first comparing circuit comprises:
  a switching unit, selecting the data signals of the first and second amplifiers to respectively transport to two output ends of the switching unit according to the first tag; and
  a search logic circuit, coupled to the switching unit, receiving the data signals of the first and second sense amplifiers, and comparing the data signals of the first and second sense amplifiers with the first tag to generate the first comparing result.

3. The memory apparatus according to claim 2, wherein the switching unit comprises:
  a first switch, receiving the inverted data signal of the first sense amplifier and deciding whether to transport the inverted data signal of the first sense amplifier to a first output end or not according to an inverted mode control signal;
  a second switch; receiving the data signal of the second sense amplifier and deciding whether to transport the data signal of the second sense amplifier to a second output end or not according to the inverted mode control signal; and
  a third switch, coupled between an end for the second switch receiving the data signal of the second sense amplifier and the first output end, and being controlled by a mode control signal,
  wherein, turned on or off statuses of the first and second switches are the same, and turned on or off statuses of the first and third switches are complementary.

4. The memory apparatus according to claim 2, wherein the search logic circuit comprises:
  a first switch, having a first end receiving the data signal of the first amplifier, a second end outputting the first comparing result, and a control end receiving the first tag;
  a second switch, having a first end coupled to the first output end of the switching unit, a second end coupled to the second end of the first switch, and a control end receiving an inverted first tag;
  a third switch, having a first end coupled to the second output end of the switching unit, and a control end receiving the first tag; and
  a fourth switch, having a first end for receiving the inverted data signal of the second amplifier, a second end coupled to the second end of the third switch, and a control end receiving the inverted first tag.

5. The memory apparatus according to claim 3, wherein the search logic circuit further comprises:
  a pre-charge circuit, coupled to the second end of the first switch and pre-charging the first comparing result to a reference power voltage according to a pre-charge signal.

6. The memory apparatus according to claim 3, wherein the search logic circuit further comprises:
  a fifth switch, coupled between the second end of the third switch and the second end of the first switch, and being controlled by the inverted first tag.

7. The memory apparatus according to claim 1, wherein each of the second comparing circuits comprises:
  a first switch, having a first end receiving corresponding data signal, a second end generating corresponding second comparing result, and a control end receiving corresponding second tag;
  a second switch, having a first end receiving corresponding inverted data signal, a second end generating corresponding second comparing result, and a control end receiving corresponding inverted second tag; and
  a pre-charge circuit, coupled between the second end of the first switch and a reference power voltage, and pre-charging the second comparing result to the reference power voltage according to a pre-charge signal.

8. The memory apparatus according to claim 1, wherein each of the second comparing circuits comprises:
  a first switch, having a first end receiving corresponding data signal and a control end receiving corresponding inverted second tag;
  a second switch, having a first end receiving corresponding inverted data signal, a second end coupled to a second end of the first switch, and a control end receiving corresponding second tag;
  a third switch, having a first end generating the second comparing result, a second end coupled to a reference ground, and a control end coupled to the second end of the first switch; and
  a pre-charge circuit, coupled between the second end of the third switch and a reference power voltage, and pre-charging the second comparing result to the reference power voltage according to a pre-charge signal.

9. The memory apparatus according to claim 1, wherein each of the second comparing circuits comprises:
  a first switch, having a first end receiving corresponding second tag, a second end generating corresponding second comparing result, and a control end receiving corresponding data signal;
  a second switch, having a first end receiving corresponding inverted second tag, a second end generating corresponding second comparing result, and a control end receiving corresponding inverted data signal; and
  a pre-charge circuit, coupled between the second end of the first switch and a reference power voltage, and pre-charging the second comparing result to the reference power voltage according to a pre-charge signal.

10. The memory apparatus according to claim 1, wherein each of the second comparing circuits comprises:
- a first switch, having a first end receiving corresponding inverted second tag, and a control end receiving corresponding data signal;
- a second switch, having a first end receiving corresponding second tag, a second end coupled to a second end of the second switch, and a control end receiving corresponding inverted data signal; and
- a third switch, having a first end for generating the corresponding second comparing result, a second end coupled to a reference ground, and a control end coupled to the second end of the first switch; and
- a pre-charge circuit, coupled between the first end of the third switch and a reference power voltage, and pre-charging the second comparing result to the reference power voltage according to a pre-charge signal.

11. The memory apparatus according to claim 1, wherein each of the second comparing circuits comprises:
- a first switch, having a first end coupled to a reference ground, and a control end receiving corresponding data signal;
- a second switch, having a first end coupled to the reference ground, and a control end receiving corresponding inverted data signal;
- a third switch, having a first end coupled to a second end of the first switch, a second end generating corresponding second comparing result, a control end receiving corresponding inverted second tag;
- a fourth switch, having a first end coupled to a second end of the second switch, a second end generating corresponding second comparing result, a control end receiving corresponding second tag; and
- a pre-charge circuit, coupled between the second end of the third switch and a reference power voltage, and pre-charging the second comparing result to the reference power voltage according to a pre-charge signal.

12. The memory apparatus according to claim 1, each of the sense amplifiers comprises:
- a first inverting circuit, having an input end for receiving corresponding inverted bit line signal and an output end for generating corresponding bit line signal; and
- a second inverting circuit, having an input end coupled to the output end of the first inverting circuit, and an output end coupled to the input end of the first inverting circuit.

13. The memory apparatus according to claim 12, each of the sense amplifiers further comprises:
- a first transistor, coupled between a reference power voltage and power receiving ends of the first and second inverting circuits, wherein the first transistor is controlled by a sensing enable signal to be turned on or off; and
- a second transistor, coupled between a reference ground and ground ends of the first and second inverting circuits, wherein the second transistor is controlled by a sensing enable signal to be turned on or off.

14. The memory apparatus according to claim 12, each of the sense amplifiers further comprises:
- an equalization circuit, coupled between the output ends of the first and second inverting circuits, and equalizing corresponding bit line signal and inverted bit lined signal to a reference voltage according to an equalization signal.

15. The memory apparatus according to claim 14, wherein the equalization circuit comprises:
- a first switch, coupled between the output end of the first inverting circuit and the reference voltage, and controlled by the equalization signal to be turned on or off; and
- a second switch, coupled between the output end of the second inverting circuit and the reference voltage, and controlled by the equalization signal to be turned on or off.

16. The memory apparatus according to claim 1, wherein the memory cells are dynamic random access memory cells.

17. The memory apparatus according to claim 1, wherein the memory cells are embedded dynamic random access memory cells.

18. The memory apparatus according to claim 1, wherein the memory cells are magnetoresistive random access memory cells.

19. The memory apparatus according to claim 1, wherein the memory cells are resistive random access memory cells.

20. The memory apparatus according to claim 1, wherein the memory cells are phase change memory cells.

21. The memory apparatus according to claim 1, wherein the memory cells are static random access memory cells.

* * * * *